United States Patent [19]

Stuke et al.

[11] Patent Number: 4,900,581
[45] Date of Patent: Feb. 13, 1990

[54] METHOD FOR PRODUCING METAL FILMS

[75] Inventors: Michael Stuke, Göttingen; Hilmar Esrom, Heidelberg; Georg Wahl, Eppelheim, all of Fed. Rep. of Germany

[73] Assignee: ASEA Brown Boveri Aktiengesellschaft, Mannheim, Fed. Rep. of Germany

[21] Appl. No.: 233,241

[22] Filed: Aug. 17, 1988

[30] Foreign Application Priority Data

Aug. 17, 1987 [DE] Fed. Rep. of Germany ....... 3727422
Jul. 30, 1988 [DE] Fed. Rep. of Germany ....... 3826046

[51] Int. Cl.⁴ .............................................. B05D 3/06
[52] U.S. Cl. ............................. 427/531; 219/121.85; 427/229; 427/282; 427/383.1
[58] Field of Search ...................... 427/53.1, 229, 282, 427/383.1; 219/121.85

[56] References Cited

U.S. PATENT DOCUMENTS 4,698,238 10/1987 Hayasha et al. .................... 427/53.1
4,784,963 11/1988 Krimmel ............................ 427/53.1
4,786,358 11/1988 Yamuzaki et al. ................. 427/53.1

FOREIGN PATENT DOCUMENTS 61-119676 6/1986 Japan ................................. 427/53.1
61-276233 12/1986 Japan ................................. 427/53.1

Primary Examiner—Stanley Silverman
Attorney, Agent, or Firm—Herbert L. Lerner; Laurence A. Greenberg

[57] ABSTRACT

A method for producing full-surface or partial metal films on a substrate includes placing a coating on a substrate. The coating is irradiated sheetwise with a laser to form the metal films.

9 Claims, 3 Drawing Sheets

METHOD FOR PRODUCING METAL FILMS

Specification

The invention relates to a method for producing full-surface or partial metal films by irradiation of a coating on a substrate with a light source.

A method for producing metal films of palladium on a substrate of silicon or quartz is described in the publication J. Appl. PHYS. 61 (4) by Gross et al, Feb. 15, 1987, pp. 1628-1632. To this end, the surface of the substrate is coated with a thin, homogeneous, amorphous film from a solution prepared from palladium acetate. In order to form a metal structure, this coating is then irradiated with the focused beam of an argon laser that emits radiation in the wavelength range of 514.5 nm. The palladium acetate is thermally decomposed by the laser radiation, which forms a metal film of palladium. The thus-formed linear palladium film is more or less porous, depending on the laser power, the scanning speed, and the thermal characteristics of both the palladium acetate solution applied and the substrate. A characteristic of the laser beam which is used is that an explosive reaction front is propagated in front of it. This reaction front limits the sharpness of the edges of the metal film which is produced. Another disadvantage is that wherever metal films are to be formed over the entire substrate, these sites must be gradually scanned with the laser beam, which is very time-consuming and therefore cost-intensive.

It is accordingly an object of the invention to provide a method for producing metal films, which overcomes the hereinafore-mentioned disadvantages of the heretofore-known methods of this general type and with which full-surface or textured metal films can be formed on a substrate faster than before and with sharply defined edge regions.

With the foregoing and other objects in view there is provided, in accordance with the invention, a method for producing full-surface or partial metal films or layers on a substrate, which comprises placing a coating on a substrate, and irradiating the coating sheetwise with a laser to form the metal films.

The sheetwise irradiation makes it possible to provide the surface of a substrate with a closed metal film or with partially textured metal films and to form them quickly everywhere. The prior art scanning of the surface of the substrate is dispensed with entirely. This is only made possible through the use of an excimer laser or a dye laser that is pulsed by an excimer laser. The beams of these lasers are used for the sheetwise irradiation.

Conventional argon lasers cannot be used for sheetwise irradiation, because only very low energy is available relative to the surface area when the beam thereof widens out. This power is too low to bring about the decomposition of the coating applied to the substrate.

In accordance with another mode of the invention, there is provided a method which comprises performing the sheetwise irradiation to produce the films by emitting radiation with the laser at least predominantly in the ultraviolet spectral range.

In accordance with a further mode of the invention, there is provided a method which comprises performing the sheetwise irradiation to produce full-surface or textured metal films by emitting radiation with an excimer laser at seven discrete wavelengths in the UV range between 157 nm and 351 nm depending on the gas filling.

In accordance with an added mode of the invention, there is provided a method which comprises performing the sheetwise irradiation to produce full-surface or textured metal films with a dye laser pulsed by an excimer laser, the dye emitting radiation continuously in the UV range at wavelengths between 320 nm and 420 nm.

In accordance with an additional mode of the invention, there is provided a method which comprises placing a prefabricated mask on the coating before irradiating the mask sheetwise with the laser to produce textured metal films.

In accordance with yet another mode of the invention, there is provided a method which comprises reproducing and aiming a beam of the laser on the coating with the aid of optical elements for irradiating the coating to produce textured metal films only at given locations at which textured films are to be produced. The full-surface or textured metal films thus formed can additionally be reinforced by currentless or electrolytic metal plating.

The adhesion of the full-surface or partial metal films generated in this way is excellent. Due to the subsequent currentless or electrolytic reinforcement, the films have high purity and thus very good electrical conductivity. The conductor tracks produced by the method according to the invention have a very good edge sharpness, which is due to the fact that the thermal influence on the decomposition of the coating made of the organic metal material is limited or nonexistent and instead the decomposition is primarily photochemical, because of the use of ultraviolet radiation.

In accordance with yet a further mode of the invention, there is provided a method which comprises scanning with an argon laser to produce textured metal films that have punctiform or geometrically complex structures.

In accordance with a concomitant mode of the invention, there is provided a method which comprises forming the coating by applying a solution to the substrate, and preparing the solution form the group consisting of metal acetates, metal acetyl acetonates and metal formiates of a metal from which the metal films are to be made, in order to produce the full-surface or textured films.

Other features which are considered as characteristic for the invention are set forth in the appended claims.

Although the invention is illustrated and described herein as constructed in a method for producing metal films, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

Figure 1:
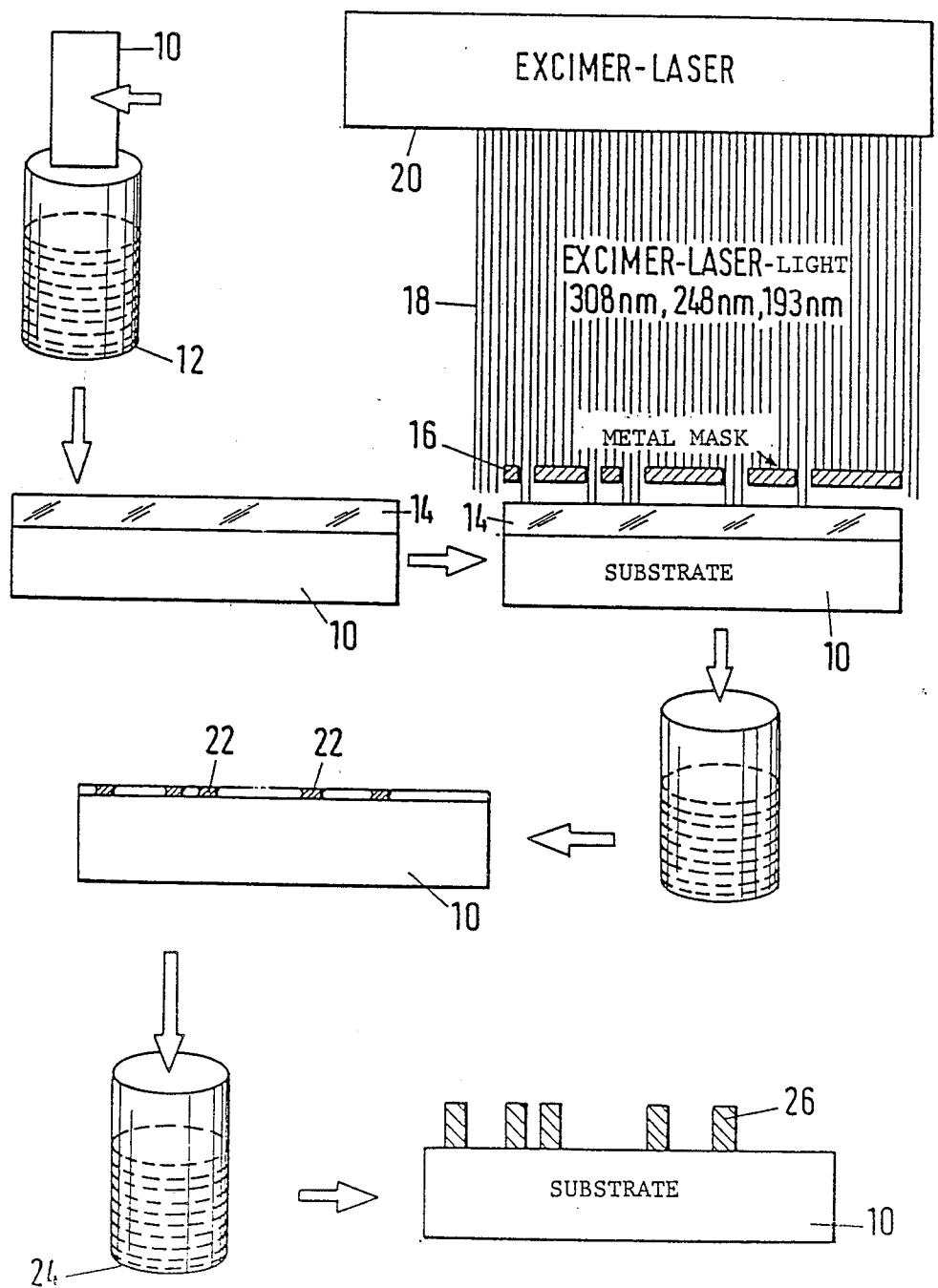
FIG. 1 is a combination of seven diagrammatic, elevational and perspective views illustrating the production of textured metal films on a substrate.

Referring now to the figures of the drawing in detail and first, particularly, to FIG. 1 thereof, there is seen a substrate 10, which is constructed as a thin rectangular plate and which is formed of vitrified or unvitrified aluminum oxide (AlO$_2$) in the illustrated embodiment. Textured metal films or layers 26 are to be formed on the surface of the substrate 10. The formation of metal films can also be carried out by the method according to the invention on other non-illustrated substrates which are made of an organic or inorganic material. The non-illustrated substrates which are used may have any arbitrary geometrical shape, but preferably thin plates are used that are made from aluminum nitride, boron silicate glass, polyimide, rubber, paper, or cardboard, as well as ceramic-filled or glass-fiber-reinforced fluorocarbon resins. In order to form the textured metal films 26, the surface of the substrate 10 is provided with a coating 14. This coating is formed by a solution of an organic metal compound. In order to form the coating in the illustrated embodiment, the substrate 10 is dipped into a solution 12 of palladium acetate. The application of the solution can naturally be carried out by other methods instead, for instance by spraying the substrate 10 with the solution or applying the solution with a brush. In order to form the coating 14, the applied film of palladium acetate solution is dried in air in an oven. During this process the solvent is evaporated. In order to form the palladium acetate solution, it is possible to use any liquids in which palladium acetate be dissolved. Once the coating 14 has been formed, a mask 16 is disposed immediately above the coating. The mask has openings formed therein at the sites at which textured metal films are to be formed on the substrate 10. The entire mask 16 is then coated sheetwise with the aid of an excimer laser 20. For example, an excimer laser that emits radiation at 308 nm, 248 nm and 193 nm is preferably used for this purpose. These excimer lasers have such high-energy that the beam thereof can be widened out by means of optical elements in such a way that a complete sheetwise irradiation of the mask located beneath them is possible. Instead of the excimer laser 20, it is also possible to use a non-illustrated dye laser which is pulsed by an excimer laser, so that the dye laser has the required initial pulsed energy necessary for sheetwise irradiation. Due to the use of suitable dyes, ultraviolet radiation having a wavelength of up to approximately 320 nm can be produced with a dye laser. With a conversion efficiency of 3% in the ultraviolet range, a pulsed energy of 10 mJ is still available. The threshold energy required to decompose the coating is on the order of approximately 2 mJ. In contrast to the dye laser, an excimer laser 20 can emit only radiation at seven discrete wavelengths between 157 nm and 351 nm, depending on the gas filling. In contrast, the wavelength of the dye laser can be staggered continuously in the ultraviolet range between 320 nm and 400 nm. Thus reactions can be purposefully initiated at a specific wavelength. In the embodiment under discussion, the decomposition of the coating 14 is performed with a 100 Hz pulsed excimer laser 20 that has a radiation power density of approximately 1 Jcm$^{-2}$ and an emission wavelength of 308 nm. Due to the disposition of the mask 16, only quite specific regions of the coating 14 are irradiated by the laser 20, but all of the regions are irradiated simultaneously. The palladium acetate is decomposed by the irradiation. During this process, palladium seeds or nuclei 22 form, so that after the irradiation has ended, textured layers of palladium having sharp edge regions are formed. The unirradiated regions of the coating 14 are then washed with the aid of a solvent, such as chloroform, so that only the textured metal films 26 remain on the surface of the substrate 10. According to the invention, the possibility exists of reinforcing these textured films 26 by means of currentless or electrodeposited metal plating. For instance, the films 26 of palladium can be reinforced by currentless copper-plating in a Shipley bath 24. The result is a substrate 10 having a thick copper film on the textured metal films 26.

Through the use of the method according to the invention, it is naturally possible to deposit textured metal films formed of other metals, such as gold, silver or copper. In order to accomplish this, appropriate coatings of suitable solutions of the appropriate organic metal compounds need merely be formed on the substrate. In order to prepare the solutions, metal acetates, metal acetyl acetonates and metal formiates of the appropriate metal are preferably used.

In the event that the textured metal films on the substrate are to have punctiform or punctuate structures or if they are to have structures with complicated geometrical shapes, then it is entirely possible to use not only the excimer laser 20 but also an argon laser to form these structures, in order to thus scan the previous sites of the mask 16.

If the surface of the substrate 10 is to be covered completely by a metal film 26, then the same method steps are used as described above. The only change is that the disposition of a mask 16 such as is shown in FIG. 1 is dispensed with. The beams arriving from the laser 20 are therefore aimed directly at the entire coating 14. As a result, the coating 14 is completely decomposed photochemically, resulting in a non-illustrated closed metal film on the entire surface of the substrate 10.

With the aid of the excimer laser 20 and optical elements such as lenses and optical diaphragms, the beam of the excimer laser can be aimed at the coating 14 of the substrate 10 in such a way that only quite specific regions of the coating 14 are irradiated. In this manner, it is possible to aim the beam of the laser at the coating 14 in such a way that a predetermined structure can be formed. Thus the mask 16 shown in FIG. 1 can be dispensed with completely. With the aid of the above-mentioned optical elements, it is possible to form the same textured metal films having the same sharply defined edge region on the substrate 10.

Figure 2:
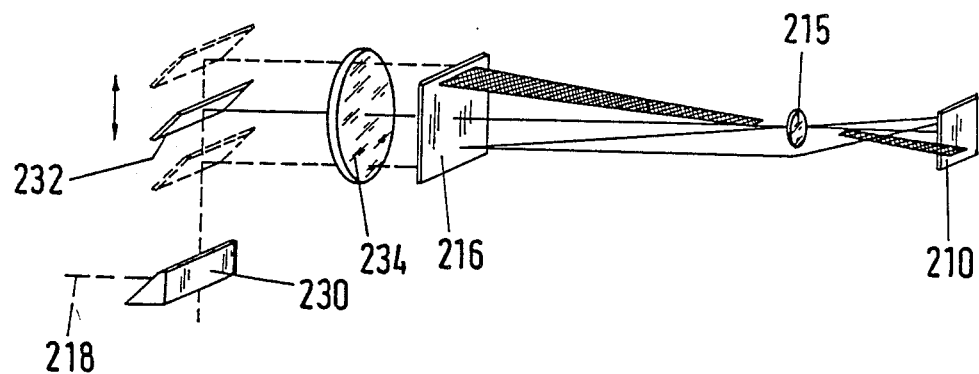
FIGS. 2 and 3 are perspective views illustrating the production of textured metal films in accordance with two further embodiments of the method.

One possibility of guiding a beam 218 of a non-illustrated laser by optical elements is shown in FIG. 2. The laser beam 218 is diverted a first time by a stationary mirror 230, it is then diverted a second time by means of a mirror 232 that is displaceable in the direction of the axis of the diverted beam, and it is aimed through a field lens 234 at a mask 216. An optical reducing element 215 reproduces the mask 216 in a smaller size on a substrate 210 which has previously been provided with a non-illustrated coating of a non-illustrated organic metal compound.

Figure 3:
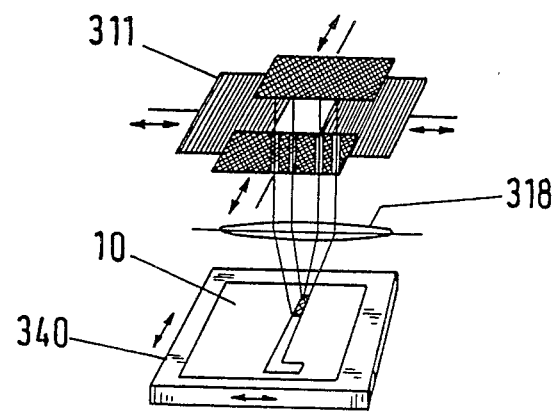

FIG. 3 illustrates the way in which textured metal films can be produced by means of a variable shutter 311, an optical reduction element 318 and a table 340, on which a substrate 10 is disposed. The table is an XY table that is displaceable in two directions in the plane of the table.

Figure 4:
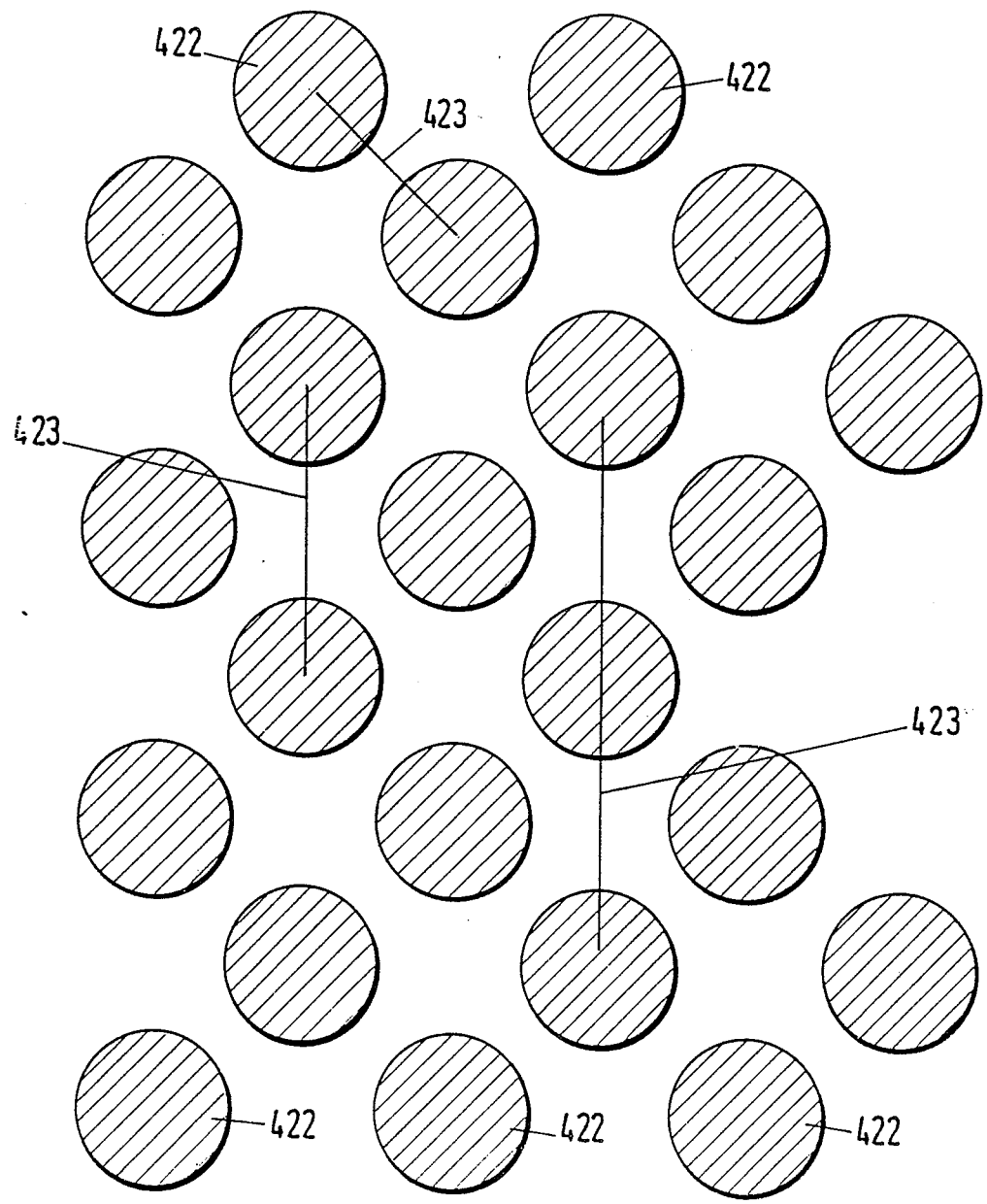
FIG. 4 is a group of top-plan views of metal textures.

FIG. 4 shows a great number of textured metal films 422 having circular cross sections, all of which were produced simultaneously by the method according to the invention, with a mask or by the use of optical elements. Some of these circular metal films 422 are joined together by linear metal films 423. The linear metal films 423 are electrically conductive connections between the circular regions 422. In order to form these very thin linear structures 423, argon lasers can be used to scan the regions between the circular regions 422 to be connected to one another. These very thin metal conductors 423 are then formed on the coating of the substrate.

The above-described method can also be used to form superconducting material on a substrate.

The foregoing is a description corresponding in substance to German Application P 38 26 046.8, dated July 30, 1988, the International priority of that application and of German Application P 37 27 422.8, dated Aug. 17, 1987 being claimed for the instant application, and being hereby made part of this application. Any material discrepancies between the foregoing specification and the aforementioned corresponding German Application P 38 26 046.8 are to be resolved in favor of the latter.

We claim:

1. Method for producing full-surface or partial films on a substrate, which comprises preparing a solution from a group consisting of metal acetates, metal acetyl acetonates and metal formiates of a metal from which a metal film is to be made, and forming a coating on a substrate by applying the solution to the substrate and then irradiating the coating sheetwise to produce a full-surface or textured metal film by emitting radiation with excimer laser at seven discrete wavelengths in the UV range between 157 nm and 351 nm depending on the gas filling.

2. Method for producing full surface or partial films on a substrate, which comprises preparing a solution from a group consisting of metal acetates, metal acetyl acetonates and metal formiates of a metal from which a metal film is to be made, and forming a coating on a substrate by applying the solution to the substrate and irradiating the coating sheetwise to produce a full-surface or textured metal film with a dye laser pulsed by an excimer laser, the dye emitting radiation continuously in the UV range at wavelengths between 320 nm and 420 nm.

3. Method for producing full-surface or partial films on a substrate, which comprises preparing a solution from the group consisting of palladium acetates, and forming a coating on a substrate by applying the solution to the substrate and then irradiating the coating sheetwise to produce a full-surface or textured palladium film by emitting radiation with an excimer laser at seven discrete wavelengths in the UV range between 157 nm and 351 nm depending on the gas filling.

4. Method according to the claims 1, which comprises placing a prefabricated mask on the coating before irradiating the mask sheetwise with the laser to produce textured metal films.

5. Method according to the claims 2, which comrises placing a prefabricated mask on the coating before irradiating the mask sheetwise with the laser to produce textured metal films.

6. Method according to the claims 1, which comprises reproducing a beam of the laser on the coating with the aid of optical elements for irradiating the coating to produce textured metal films only at given locations at which textured films are to be produced.

7. Method according to the claims 2, which comprises reproducing a beam of the laser on the coating with the aid of optical elements for irradiating the coating to produce textured metal films only at given locations at which textured films are to be produced.

8. Method according to the claims 1, which comprises scanning with an argon laser to produce textured metal films having punctiform or geometrically complex structures.

9. Method according to the claims 2, which comprises scanning with an argon laser to produce textured metal films having punctiform or geometrically complex structure.

* * * * *